United States Patent
Wang et al.

(10) Patent No.: US 6,371,045 B1
(45) Date of Patent: Apr. 16, 2002

(54) PHYSICAL VAPOR DEPOSITION DEVICE FOR FORMING A METALLIC LAYER ON A SEMICONDUCTOR WAFER

(75) Inventors: Kun-Chih Wang, Tao-Yuan; Chao-Ching Hsieh, Hsin-Chu Hsien, both of (TW)

(73) Assignee: United Microelectronics Corp., Hsin-Chu (TW)

( * ) Notice: Subject to any disclaimer, the term of this patent is extended or adjusted under 35 U.S.C. 154(b) by 0 days.

(21) Appl. No.: 09/360,627

(22) Filed: Jul. 26, 1999

(51) Int. Cl.[7] .............................................. C23C 16/00
(52) U.S. Cl. ..................... 118/723 MP; 118/723 E; 118/723 I; 204/298.12; 204/298.16
(58) Field of Search ..................... 118/723 R, 723 MA, 118/723 HC, 723 E, 723 I, 723 MP; 156/345; 219/121.15, 121.43; 204/298.16, 298.12

(56) References Cited

U.S. PATENT DOCUMENTS 4,384,933 A * 5/1983 Takasaki ..................... 204/192
5,659,276 A * 8/1997 Miyata ........................ 336/98
6,023,038 A * 3/2000 Van Gogh ............. 219/121.43

* cited by examiner

Primary Examiner—Thi Dang
(74) Attorney, Agent, or Firm—Winston Hsu

(57) ABSTRACT

The present invention provides a physical vapor deposition device for forming a metallic layer with a predetermined thickness on a semiconductor wafer. The PVD device comprises a chamber, a wafer chuck installed at the bottom end of the chamber through which the semiconductor wafer is hold horizontally, a metallic ion generator for generating metallic ions, an electric field generator for forming a vertical electric field above the wafer chuck that guides the metallic ions toward the wafer chuck, and a magnetic field generator. The magnetic field generator generates a magnetic field perpendicular to the direction of movement of the metallic ions to create a horizontal moving force on the metallic ions thus causing the metallic ions to deposit on the semiconductor wafer at a slant angle.

7 Claims, 2 Drawing Sheets ated PVD processing has been developed in order to enhance PVD step coverage and optimize the ability of PVD to fill holes and voids. This process generates metallic ions to deposit a metallic layer and enables the formation of a metallic layer in smaller holes.

PHYSICAL VAPOR DEPOSITION DEVICE FOR FORMING A METALLIC LAYER ON A SEMICONDUCTOR WAFER

BACKGROUND OF THE INVENTION

1. Field of the Invention

The present invention relates to a physical vapor deposition device (PVD) for forming a metallic layer on a semiconductor wafer, and more particularly, to a physical vapor deposition device for forming a metallic layer on a semiconductor wafer with an ionized physical vapor deposition process.

2. Description of the Prior Art

Physical Vapor Deposition is a Semiconductor deposition technique using physical methods often employed to deposit a metal layer on a semiconductor wafer. Currently, ionized PVD processing has been developed in order to enhance PVD step coverage and optimize the ability of PVD to fill holes and voids. This process generates metallic ions to deposit a metallic layer and enables the formation of a metallic layer in smaller holes.

Please refer to FIG. 1. FIG. 1 is a cross-sectional schematic diagram of the semiconductor wafer 12 after undergoing the ionized PVD process according to the prior art. The semiconductor wafer 12 comprises a plurality of holes that serve as contact holes and via holes needed in the fabrication process. During formation of the metallic layer 14 on the semiconductor wafer 12 using ionized PVD processing in the prior art nphysical vapor deposition device (not shown), neutral metallic atoms are ionized to form positively charged metallic ions 10 and a vertical electric field is formed above the semiconductor wafer 12. This electric field causes the metallic ions 10 to migrate toward the semiconductor wafer 12 where they become deposited. Thus, a metallic layer 14 forms on the semiconductor wafer 12 and within the holes 16. The arrow 18 in FIG. 1 indicates the direction of movement of the metallic ions 10 and the arrow 20 shows the direction of the electric field.

The metallic layer 14 deposited on the semiconductor wafer 12 not only conducts electric current, but also prevents contamination by isolating the semiconductor wafer from subsequently formed matter. It is clear that semiconductor wafer 12 quality is assured only if the metallic layer 14 deposited at each position on the semiconductor wafer 12 achieves a predetermined thickness. In the ionized PVD process of the prior art, the metallic ions 10 move in a downward direction to deposit on the semiconductor wafer 12. Therefore, the metallic ions more readily deposit on the bottom of the holes 16 than on the vertical-side wall of the holes 16. In this way, it is difficult to achieve an appropriate thickness of the metallic layer 14 on the vertical-side wall of the holes 16 during the fabrication process.

SUMMARY OF THE INVENTION

It is therefore a primary objective of the present invention to provide a physical vapor deposition device for forming a metallic layer on a semiconductor wafer with an ionized physical vapor deposition process on a semiconductor wafer to solve the above mentioned problem.

In a preferred embodiment, the present invention provides a physical vapor deposition device for forming a metallic layer on a semiconductor wafer comprising:

a chamber;
a wafer chuck installed on a bottom end of the chamber for holding the semiconductor wafer horizontally;
a metallic ion generator for generating metallic ions above the wafer chuck;
an electric field generator for forming a vertical electric field above the wafer chuck to guide the metallic ions toward the wafer chuck; and
a magnetic field generator for generating a magnetic field in a direction perpendicular to the moving direction of the metallic ions to create a horizontal moving force over the metallic ions and thus causing the metallic ions to deposit on the semiconductor wafer at a slant angle.

It is an advantage of the present invention that the ionized physical vapor deposition process can form a metallic layer on the vertical-side wall of the holes on the semiconductor wafer meeting the necessary thickness required in the fabrication process.

These and other objectives of the present invention will no doubt become obvious to those of ordinary skill in the art after reading the following detailed description of the preferred embodiment which is illustrated in the various figures and drawings.

DETAILED DESCRIPTION OF THE PREFERRED EMBODIMENT

Figure 1:
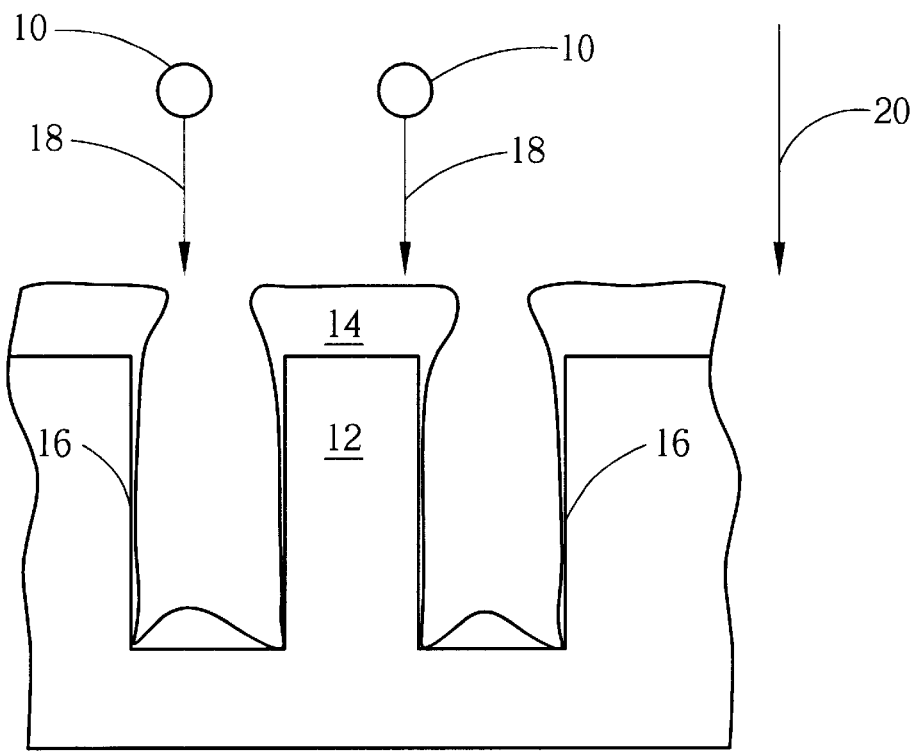
FIG. 1 is a cross-sectional schematic diagram of the physical vapor deposition device for forming a metallic layer on a semiconductor wafer according to the prior art.
Figure 3:
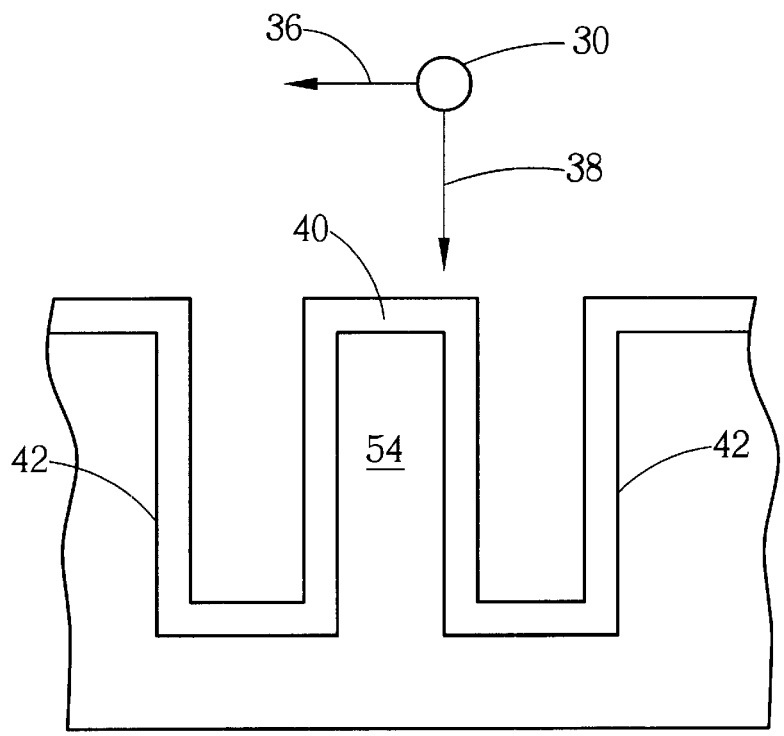
FIG. 3 is a cross-sectional schematic diagram of the ionized physical vapor deposition process on the semiconductor wafer shown in FIG. 2.
Figure 2:
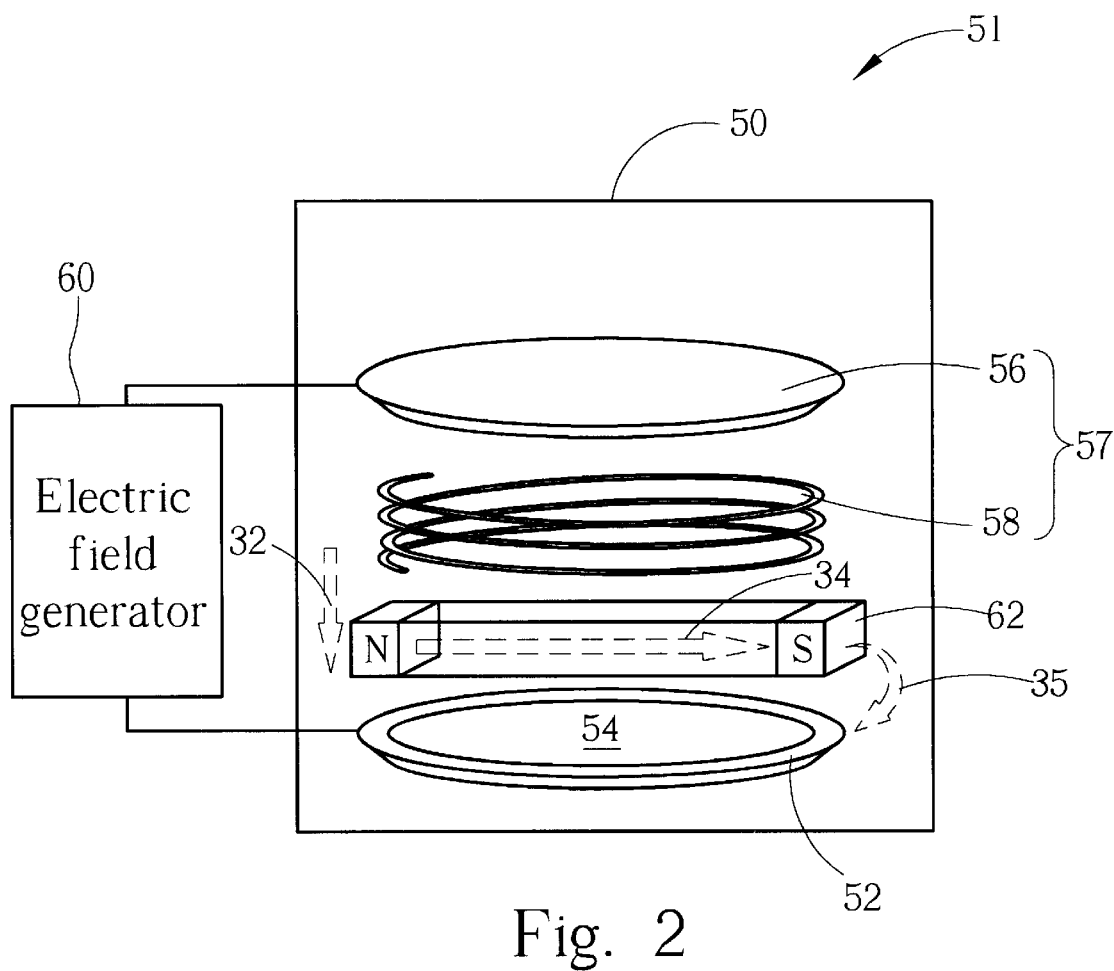
FIG. 2 is a schematic diagram of the physical vapor deposition device for forming a metallic layer on a semiconductor wafer with an ionized physical vapor deposition process according to the present invention.

Please refer to FIG. 2 and FIG. 3. FIG. 2 is a schematic diagram of the PVD device 51 according to the present invention. FIG. 3 is a cross-sectional schematic diagram of the ionized PVD process on the semiconductor wafer 54 shown in FIG. 2. The PVD device 51 of the present invention is employed in an ionized PVD process to form a metallic layer 40 on the semiconductor wafer 54 which is circular in shape. As shown in FIG. 2, the PVD device 51 according to the present invention comprises a chamber 50, a wafer chuck 52 installed on the bottom end of the chamber 50 through which the semiconductor wafer 54 is horizontally hold, a metallic ion generator 57 for generating metallic ions above the wafer chuck 52, an electric field generator 60, and a magnetic field generator 62.

The metallic ion generator 57 comprises a circular shaped metallic target 56 made of tantalum or copper and is installed above the wafer chuck 52 at the top end of the chamber 50. The metallic ion generator further comprises a coil of circular electric wires 58 positioned between the metallic target 56 and the wafer chuck 52 for generating an alternating electric field. The electric field generator 60 electrically connects to and generates a voltage difference between the metallic target 56 and the wafer chuck 52 to form a vertical electric field above the wafer chuck 52. The magnetic field generator 62 generates a magnetic field above the wafer chuck 52 in a direction perpendicular to the migration of the metallic ions and parallel to the semiconductor wafer 54. The magnetic field above the wafer chuck 52 is rotated at a predetermined speed. The arrow 32 in FIG. 2 shows the direction of the electric field, the arrow 34 shows the direction of the magnetic field, and the arrow 35 shows the direction of rotation of the magnetic field.

As shown in FIG. 3, the semiconductor wafer 54 is circular in shape and comprises a plurality of holes 42 serving as contact holes and via holes. During ionized PVD processing of the semiconductor wafer 54 in the PVD device 51, the semiconductor wafer 54 is placed onto the wafer chuck 52. The air in the chamber 50 is evacuated forming a vacuum after which argon is introduced to form argon ions. The argon ions in the chamber 50 then strike the metallic target 56 to release metallic atoms. The argon ions easily strike the released metallic atoms to form the metallic ions 30 under the influence of the alternating electric field generated by the coil of circular electric wires 58. The field generator 60 generates a voltage level difference between the metallic target 56 and the wafer chuck 52 and forms a vertical electric field above the wafer chuck 52 to guide the metallic ions 30 in the chamber 50 toward the wafer chuck, 52 in a vertical direction. At the same time, the magnetic field generator 62 generates a magnetic field above the wafer chuck 52 perpendicular to the direction of migration of the metallic ions 30. This generates a horizontal moving force on the metallic ions 30 which propels them horizontally at increased velocity. Arrow 36 in FIG. 3 indicates the direction of the horizontal moving force on the metallic ions 30 and arrow 38 shows the vertical direction of migration of the metallic ions 30.

The metallic ions 30 move in a vertical direction but the metallic ions 30 may deposit on the semiconductor wafer 54 at a slant angle due to increases in the horizontal velocity of the metallic ions 30 secondary to effects from the horizontal moving force. Thus, the metallic ions 30 more easily deposit on the vertical-side wall of the holes 42. To even the thickness of the side-wall in a hole, the magnetic field above the wafer chuck 52 is horizontally rotated at a predetermined speed. This causes continuous change in the direction of the horizontal moving force on the metallic ions 30 coinciding with movement of the magnetic field 34 causing the metallic ions 30 to deposit on the vertical-side wall of the holes 42 in different directions. As a result, the metallic layer 40 forms on the bottom and the vertical-side wall of each hole 42 on the semiconductor wafer 54 at a predetermined thickness.

In order to increase the ability of the ionized PVD process to fill holes, the PVD device 51 according the present invention employs two controllable steps during the ionized PVD process. In the first controllable step, the electric field generator 60 is turned on and the magnetic field generator 62 is turned off thus causing the metallic ions 30 to deposit on the bottom of the hole 42 on the semiconductor wafer 54 without any influence from the magnetic field. In the second controllable step, both the electric field generator 60 and the magnetic field generator 62 are turned on causing the metallic ions 30 to deposit on the vertical-side wall of the hole 42 at a slant angle. Thus, the metallic layer 40 forms at a uniform thickness on the bottom and the vertical-side wall of the hole 42.

In contrast to the prior art of the PVD device, the PVD device according to the present invention comprises a magnetic field generator for generating a magnetic field in a direction perpendicular to the direction of movement of the metallic ions 30. The magnetic field is horizontally rotated at a predetermined speed to exert a horizontal moving force on the metallic ions 30 causing them to deposit on the semiconductor wafer at a slant angle. As a result, the minimum required thickness of the metallic layer 40 deposited on the vertical-side wall of the holes 42 can be attained during the fabrication process and optimum quality of semiconductor fabrication process is assured.

Those skilled in the art will readily observe that numerous modifications and alterations of the device may be made while retaining the teaching of the invention. Accordingly, the above disclosure should be construed as limited only by the metes and bounds of the appended claims.

What is claimed is:

1. A physical vapor deposition device for forming a metallic layer on a semiconductor wafer comprising:

a chamber;

a wafer chuck installed on a bottom end of the chamber for holding the semiconductor wafer horizontally;

a metallic ion generator for generating metallic ions above the wafer chuck;

an electric field generator for forming a vertical electric field above the wafer chuck to guide the metallic ions toward the wafer chuck; and a magnetic field generator for generating a magnetic field in a direction perpendicular to the moving direction of the metallic ions to create a horizontal moving force over the metallic ions and thus causing the metallic ions to deposit on the semiconductor wafer at a slant angle.

2. The device in claim 1 wherein the magnetic field generator is a rotating magnetic generator which rotates at a predetermined speed to generate a rotating magnetic field above the wafer chuck.

3. The device in claim 1 wherein the chamber comprises argon ions as reactive gases.

4. The device in claim 1 wherein the metallic ion generator comprises a metallic target positioned on a top end of the chamber above the wafer chuck over which reactive gases filling in the chamber will strike the metallic target to release metallic atoms, and metallic ion generator further comprises a bundle of circular electric wires positioned between the metallic target and the wafer chuck for generating an alternating electric field such that the reactive gases in the chamber may easily strike the released metallic atoms to form the metallic ions.

5. The device in claim 4 wherein the electric field generator is electrically connected to the metallic target and the wafer chuck for generating a voltage level difference between the metallic target and the wafer chuck to form the electric field.

6. The device in claim 4 wherein the metallic target is circular in shape.

7. The device in claim 4 wherein the metallic target is made of tantalum or copper.

* * * * *